(12) United States Patent
Winger et al.

(10) Patent No.: US 7,646,814 B2
(45) Date of Patent: Jan. 12, 2010

(54) LOW COMPLEXITY TRANSCODING BETWEEN VIDEOSTREAMS USING DIFFERENT ENTROPY CODING

(75) Inventors: Lowell L. Winger, Waterloo (CA); Eric C. Pearson, Conestogo (CA)

(73) Assignee: LSI Corporation, Milpitas, CA (US)

( * ) Notice: Subject to any disclaimer, the term of this patent is extended or adjusted under 35 U.S.C. 154(b) by 949 days.

(21) Appl. No.: 10/739,829

(22) Filed: Dec. 18, 2003

(65) Prior Publication Data

US 2005/0147172 A1 Jul. 7, 2005

(51) Int. Cl.
*H03M 7/40* (2006.01)
*H04N 7/12* (2006.01)
*H04N 11/02* (2006.01)
*H04N 11/04* (2006.01)

(52) U.S. Cl. .......................... 375/240.23; 375/240.01; 375/240.08; 375/240.2; 341/65; 341/67

(58) Field of Classification Search ............ 375/240.01, 375/240.08, 240.23, 240.2; 341/65, 67
See application file for complete search history.

(56) References Cited

U.S. PATENT DOCUMENTS

| 5,510,841 | A | * | 4/1996 | Iwamura | ................ 375/240.24 |
|---|---|---|---|---|---|
| 5,596,376 | A | | 1/1997 | Howe | ........................ 348/718 |
| 6,462,791 | B1 | | 10/2002 | Zhu | |
| 6,646,578 | B1 | * | 11/2003 | Au | ................ 341/67 |
| 6,744,387 | B2 | | 6/2004 | Winger | |
| 6,909,745 | B1 | | 6/2005 | Puri et al. | |
| 6,909,812 | B1 | * | 6/2005 | Faryar et al. | ................ 382/251 |
| 7,158,684 | B2 | * | 1/2007 | Cheung et al. | ............... 382/246 |
| 2003/0108103 | A1 | * | 6/2003 | Natsume | ................ 375/240.23 |
| 2003/0215018 | A1 | * | 11/2003 | MacInnis et al. | ....... 375/240.25 |
| 2004/0114683 | A1 | * | 6/2004 | Schwarz et al. | .......... 375/240.2 |
| 2004/0136457 | A1 | * | 7/2004 | Funnell et al. | ......... 375/240.01 |

OTHER PUBLICATIONS

"Method and System for Symbol Binarization", Winger, LSI Logic Corporation, U.S. Appl. No. 10/770,213, filed Feb. 2, 2004.

* cited by examiner

*Primary Examiner*—Andy S. Rao
*Assistant Examiner*—Chikaodili E Anyikire
(74) *Attorney, Agent, or Firm*—Christopher P. Maiorana, PC (57) ABSTRACT

A method for transcoding between videostreams using different entropy coding, comprising the steps of (A) decoding a first videostream using a first set of entropy codes, and (B) generating a second videostream by entropy encoding the decoded first videostream using a second set of entropy codes. The first set of entropy codes and the second set of entropy codes are configured to represent all valid coefficient values of the first videostream.

19 Claims, 5 Drawing Sheets

LOW COMPLEXITY TRANSCODING BETWEEN VIDEOSTREAMS USING DIFFERENT ENTROPY CODING

FIELD OF THE INVENTION

The present invention relates to video compression generally and, more particularly, to a method and/or apparatus for low complexity transcoding between videostreams using different entropy coding.

BACKGROUND OF THE INVENTION

Digital video data is compressed for many applications. Transmission over limited bandwidth channels such as direct broadcast satellite (DBS) and storage on optical media (i.e., CD, DVD, etc.) are typical examples. In order to achieve efficient compression, complex, computationally intensive processes are used for encoding (or compressing) and decoding (or decompressing) the digital video data. One conventional standard for compressing video is MPEG-2. However, other compression standards, such as H.264, are being developed. H.264 compression obtains high efficiency in compression. H.264 compression uses only 50-60% of the bitrate used by MPEG-2 compression to provide the same quality of video.

Video data compression methods use some form of entropy coding. Motion vectors and other overhead such as transform coefficients are compressed using entropy coding. There are many types of well known entropy coding techniques, including Huffman coding and Context-based Adaptive Binary Arithmetic Coding (CABAC). For example, MPEG-2 uses Huffman encoding, whereas H.264 supports both Huffman and CABAC encoding. While CABAC is more efficient than Huffman encoding, CABAC uses significantly more processing power. This is particularly true for a real-time encoder or decoder that processes each picture in a bounded amount of time.

CABAC encoding and decoding is a multi-step, serial process. It is difficult to speed up the CABAC encoding and decoding process with parallel hardware. In high definition video, an entire second of compressed video data can be concentrated in one frame (i.e., one-thirtieth of a second). When the compressed video data is concentrated in one frame, the bit rate of the one second of compressed data is uneven. An uneven bit rate can make CABAC encoding and decoding difficult.

One conventional approach to the problem includes running the encoding/decoding hardware at a high frequency to handle the uneven bit rate problem. Disadvantages of the conventional approaches include high power consumption associated with high speed hardware. Also, frames can be dropped if the processing hardware cannot handle the data burst. High power devices are often not suitable for consumer products. In order to achieve the increased compression offered by CABAC, many sophisticated, processing intensive tools are used. Additionally, the hardware for encoding and decoding can be very complicated if parallel processing structures are implemented.

Conventional approaches transcode between different video formats to first decode the bitstream to get baseband video. The video is then re-encoded into the new format. Conventional approaches use many methods to reduce the complexity of the re-encoding by re-using syntax elements from the decoded video to aid the re-encoding of the video.

Unlike other conventional video standards that contained only one entropy coding solution, the H.264 standard allows transcoding a context adaptive variable length coded (CAVLC) entropy-encoded H.264 videostream to make a context adaptive binary arithmetic coded (CABAC) entropy-encoded H.264 videostream by entropy-decoding the CAVLC stream to get the syntax element values. The syntax element values are entropy-encoded with the CABAC method of entropy coding.

Since such conventional transcoding does not use a complete H.264 decode and H.264 re-encode, the transcoding from CAVLC to CABAC can be done very cheaply (or inexpensively). The cheap transcoding method for CAVLC-to-CABAC is only possible because CABAC is capable of directly representing all values of all syntax elements in a CAVLC bitstream. However, the same property does not hold when attempting to transcode a CABAC stream to produce a CAVLC stream because, in the standard ITU-T Rec. H.264 | ISO/IEC 14496-10 AVC (aka H.264), CABAC is capable of representing 15 and 16-bit quantized coefficient values while CAVLC can represent only up to 12.3-bit quantized coefficient values.

It would be desirable to provide a method for encoding and/or decoding a compressed video stream that uses an entropy encoding method in a manner that is well suited for low-cost, low-power, and/or real-time devices.

SUMMARY OF THE INVENTION

The present invention concerns a method for transcoding between videostreams using different entropy coding, comprising the steps of (A) decoding a first videostream using a first set of entropy codes, and (B) generating a second videostream by entropy encoding the decoded first videostream using a second set of entropy codes. The first set of entropy codes and the second set of entropy codes are configured to represent all valid coefficient values of the first videostream.

The objects, features and advantages of the present invention include providing low complexity transcoding between video streams using different entropy coding that may provide (i) an inexpensive CABAC->CAVLC transcoder using extended CAVLC codes, (ii) an inexpensive extended-CAVLC-to-CABAC transcoder using extended CAVLC codes, (iii) an inexpensive CABAC->CAVLC transcoder that clips coefficient values, (iv) a CABAC encoder that clips all coefficients to a range that is representable by CAVLC codes (e.g., approximately 12-bits for H.264, but may be different for each sample bitdepth of the H.264/PExt standard) and/or (v) an extended set of CAVLC codes capable of representing larger coefficients.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may solve the problem of how to cheaply (e.g., cost effectively) transcode between two different types of H.264 bitstreams. Namely, how to economically transcode a context adaptive binary arithmetic coded (CABAC) entropy-encoded H.264 bitstream into a context adaptive variable length coded (CAVLC) entropy-encoded H.264 bitstream.

The present invention may also have a practical implication for encoders using CAVLC as an intermediate format during CABAC encoding. For example, the present invention may be used in an encoder that (i) includes a low-cost CAVLC-to-CABAC transcoder to reduce the cost of a CABAC encoder, (ii) achieves very high bitrate CABAC encoding rates, and (iii) may be implemented without excessive silicon cost.

Figure 1:
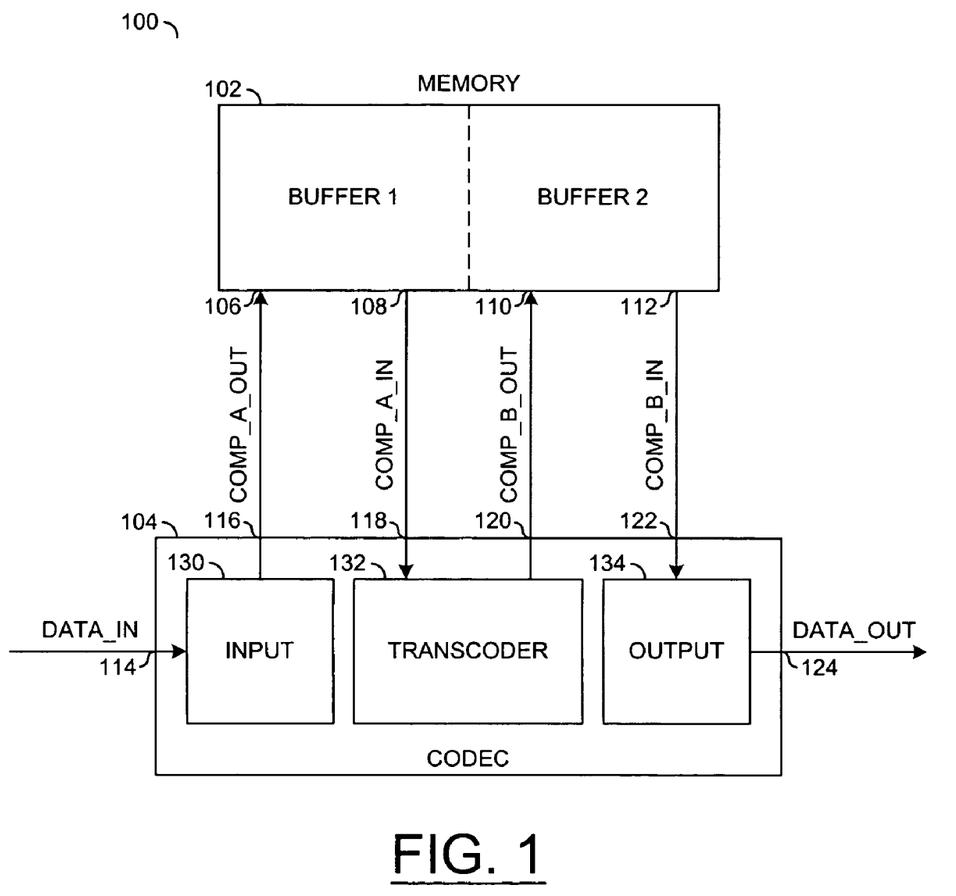
FIG. 1 is a block diagram of a preferred embodiment of the present invention.

Referring to FIG. 1, a block diagram of a circuit 100 is shown illustrating a preferred embodiment of the present invention. The circuit 100 generally provides an encoder/decoder architecture for high quality video compression and decompression that may be configured to use context-based adaptive binary arithmetic coding (CABAC). The circuit 100 generally receives an input signal (e.g., DATA_IN) and generates an output signal (e.g., DATA_OUT). When the circuit 100 is implemented as an encoder circuit, the signal DATA_IN may comprise uncompressed data (e.g., video, audio, etc.) to be compressed and the signal DATA_OUT may comprise a compressed data (or bit) stream (e.g., for transmission or storage). When the circuit 100 is implemented as a decoder circuit, the signal DATA_IN may comprise a compressed data (or bit) stream (e.g., MPEG-4, H.264, etc. compressed video) and the signal DATA_OUT may comprise an uncompressed data stream (e.g., video, audio, data, etc.).

The circuit 100 generally comprises a circuit 102 and a circuit 104. The circuit 102 may be implemented as a memory circuit. The circuit 104 may be implemented as an encoder, a decoder or an encoder/decoder (CODEC) circuit (or block). The circuit 102 may comprise a first portion (e.g., BUFFER1) and a second portion (e.g., BUFFER2). In one example, BUFFER1 and BUFFER2 may be implemented as sections of a single memory device. Alternatively, BUFFER1 and BUFFER2 may be implemented as individual memory devices. In one example, BUFFER1 and BUFFER2 may be implemented as first-in first-out (FIFO) memories.

The circuit 102 may have an input 106 that may receive a signal (e.g., COMP_A_OUT), an output 108 that may present a signal (e.g., COMP_A_IN), an input 110 that may receive a signal (e.g., COMP_B OUT), and an output 112 that may present a signal (e.g., COMP_B_IN). The signals COMP_A_OUT and COMP_A_IN may communicate a first representation of data compressed in a first format (e.g., Huffman coding, CABAC, H.264, etc.). The circuit 102 may be configured to receive the compressed data in the first format via the signal COMP_A_OUT, store the data, retrieve the data and present the compressed data via the signal COMP_A_IN. The circuit 102 may be configured to store the compressed data received via the signal COMP_A_OUT in BUFFER1.

The signals COMP_B_OUT and COMP_B_IN may comprise a second representation of data, compressed using a second compression format (e.g., Huffman coding, CABAC, H.264, etc.). The circuit 102 may be configured to store the compressed data received via the signal COMP_B_OUT in BUFFER2. The circuit 102 may be configured to present the compressed data stored in BUFFER2 via the signal COMP_B_IN.

The circuit 104 may have an input 114 that may receive the signal DATA_IN, an output 116 that may present the signal COMP_A_OUT, an input 118 that may receive the signal COMP_A_IN, an output 120 that may present the signal COMP_B_OUT, an input 122 that may receive the signal COMP_B_IN, and an output 124 that may present the signal DATA_OUT. The circuit 104 may be configured to generate the signal COMP_A_OUT in response to the signal DATA_IN. The circuit 104 may be configured to generate the signal COMP_B_OUT in response to the signal COMP_A_IN. The circuit 104 may be configured to generate the signal DATA_OUT in response to the signal COMP_B_IN. The circuit 104 may be configured to generate one or more control signals for controlling the data flow to and from the circuit 102.

The circuit 104 generally comprises a circuit 130, a circuit 132 and a circuit 134. The circuit 130 may be implemented as an input circuit. The circuit 132 may be implemented as a transcoder circuit. The circuit 134 may be implemented as an output circuit. In one example, the circuit 130 may be implemented as a bit-stream capture unit. Alternatively, the circuit 130 may be implemented as a video encoding circuit.

In one example, the circuit 132 may be configured to translate data between a first representation of data (e.g., a context-based adaptive binary arithmetic coding scheme) and a second representation of the data (e.g., a simpler entropy coding scheme, such as Huffman, non-CABAC H.264, etc.). Alternatively, the circuit 132 may be configured to translate data from the simpler entropy coding scheme into the context-based adaptive binary arithmetic coding scheme. For example, the circuit 132 may be configured to translate directly from the context-based adaptive binary arithmetic coding scheme to a simpler entropy coding scheme (e.g., Huffman coding or non-CABAC encoding scheme). In one example, two formats may be implemented for the simpler compressed format: a) binarized but not CABAC and/or b) Huffman for coefficients and binarized but not CABAC for the rest. The first may be symbols that use the same variable-length binarization as H.264 CABAC but without arithmetic coding. The second format may be a H.264 representation using the Huffman (e.g., not CABAC) option for entropy encoding.

In general, the circuit 132 comprises a lossless entropy transcoder. Entropy encoding generally refers to representing a set of symbols in a way that the symbols can be exactly recovered from the representation. Furthermore, based on a statistical model, the representation generally uses, on average, fewer bits than the direct way of representing the data. The circuit 132 generally performs an entropy decode (e.g., a Huffman decode, a CABAC decode, etc.) on the signal COMP_A_IN and an entropy encode on the result of the decode operation (e.g., with a Huffman encode, CABAC encode, non-CABAC encode, etc.) for presentation as the signal COMP_B_OUT.

The circuit 134 may be implemented, in one example, as a real time video decoder circuit. In this example, the circuit 134 generally comprises a variable length code (VLC) decoder, dequantisation unit, and inverse transform unit that can be used to reconstruct pictures from a compressed bit stream. In a second example, the circuit 134 may be implemented as video transmission unit.

Figure 2:
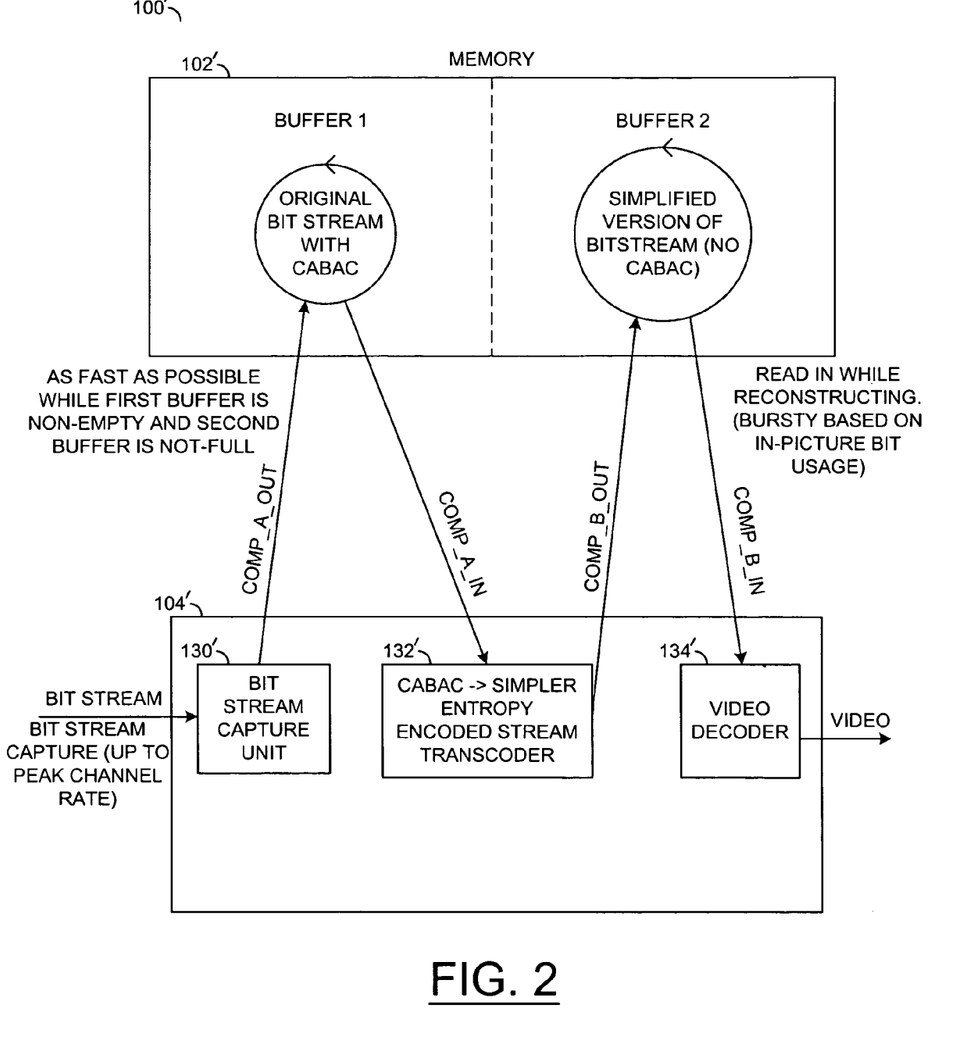
FIG. 2 is a block diagram of a decoder architecture/process in accordance with a preferred embodiment of the present invention.

Referring to FIG. 2, a block diagram of a circuit 100' is shown illustrating a decoder application in accordance with a preferred embodiment of the present invention. In one example, the circuit 100' may comprise a single integrated circuit (IC) decoder 104' and an external memory 102'. The circuit 102' may be implemented similarly to the circuit 102. The circuit 104' may comprise a circuit 130', a circuit 132' and a circuit 134'. The circuit 130' may be implemented as a bit-stream capture unit. The circuit 132' may be implemented as a transcoder circuit. The circuit 134' may be implemented as a real-time video decoder circuit.

The circuit 130' may be configured to receive a compressed data bit-stream (e.g., a signal BITSTREAM) and store the bit-stream in a first buffer implemented in the memory 102'. The circuit 132' may be configured to (i) retrieve the bit-stream from the memory 102', (ii) convert encoded data (e.g., encoded with CABAC) into a simpler encoded bit-stream (e.g., without CABAC) and (iii) store the simpler encoded bit-stream into a second buffer implemented in the memory 102'. The circuit 134' may be configured to (i) retrieve the simpler encoded bit-stream from the second buffer and (ii) decode the bit-stream, in one example, into video stream (e.g., a signal VIDEO). The circuit 130' is generally configured to store the bit-stream as fast as possible while the first buffer is non-empty and the second buffer is not full. Data is generally read from the second buffer while being reconstructed. In general, the second buffer may be sized to hold approximately 1 second of video. The data from the second buffer may be bursty based on, for example, in-picture bit usage.

Figure 3:
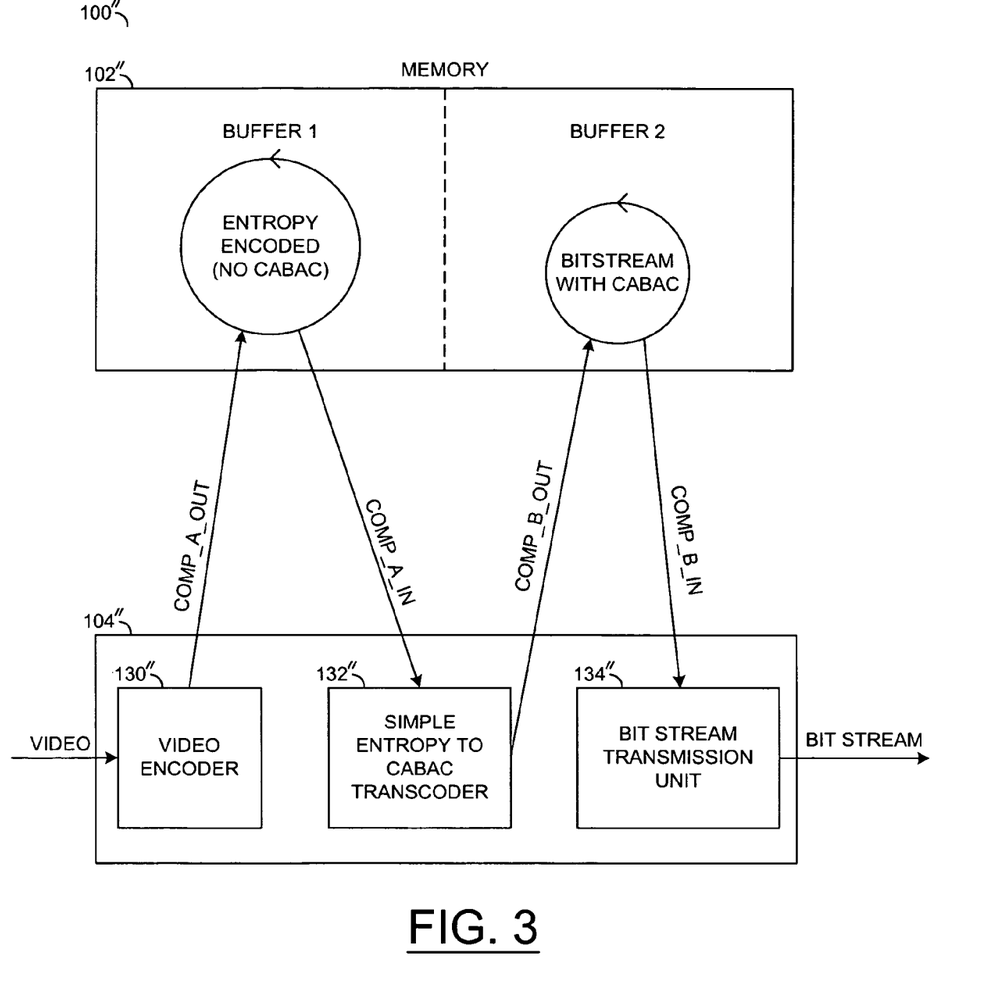
FIG. 3 is a block diagram of an encoder architecture/process in accordance with a preferred embodiment of the present invention.

Referring to FIG. 3, a block diagram of a circuit 100" is shown illustrating an encoder application in accordance with a preferred embodiment of the present invention. In one example, the circuit 100" may comprise a single integrated circuit (IC) decoder 104" and an external memory 102". The circuit 102" may be implemented similarly to the circuit 102. The circuit 104" may comprise a circuit 130", a circuit 132" and a circuit 134". The circuit 130" may be implemented, in one example, as a real-time video encoder. The circuit 132" may be implemented as a transcoder circuit. The circuit 134" may be implemented as a bit-stream transmission unit.

The circuit 130" may be configured to (i) receive an uncompressed video stream, encode the video stream with, for example, entropy coding (e.g., Huffman, universal variable length code (UVLC), etc.), and (iii) store the encoded data stream in a first buffer implemented in the memory 102". The circuit 132" may be configured to (i) retrieve the encoded data from the memory 102", (ii) convert encoded data (e.g., with no CABAC) into a more compact encoded bit-stream (e.g., with CABAC) and (iii) store the further compressed data stream into a second buffer implemented in the memory 102". The circuit 134" may be configured to (i) retrieve the compressed data stream from the second buffer and (ii) and transmit the compressed data bit-stream (e.g., as the signal BITSTREAM).

The present invention includes several implementations. First, for CAVLC-to-CABAC transcoding, an inexpensive transcoder may be implemented for CAVLC entropy-decoding followed by CABAC entropy-encoding. For CAVLC-to-CABAC transcoding, none of the other standard blocks of an encoder or decoder are needed (e.g., (inverse)transform, (inverse)quantization, etc. may be skipped).

Second, for the PExt version of the H.264 standard (e.g., aka H.264/PExt) CAVLC codes may either (a) represent all valid coefficient values that CABAC can (e.g., up to 15-bits for H.264 and for 8-bit video with H.264/PExt, up to 15 x-bits for 8 x-bit H.264/PExt sample bitdepth video) or (b) represent all coefficient values that can be produced from encoding of residuals that are 1-bit greater in size than the bit-depth of the video format in use (e.g., for 8-bit video 9-bit residuals are naturally the largest residuals that would be expected from standard encoding methods). The H.264 standard does not limit bitstreams to contain only 9-bit residuals, so that a pathological bitstream for 8-bit video may possibly contain larger residuals.

In the case of (a), a completely standard compliant CABAC-to-CAVLC transcoder may be cheaply implemented by CABAC entropy decoding followed by CAVLC entropy encoding. In this case the present invention may implement both an inexpensive standard compliant transcoder, and the extended CAVLC codes that enable CAVLC to represent all CABAC coefficient values.

In the case of (b), the implementation as described above for (a) (e.g., an inexpensive CABAC-to-CAVLC transcoder, and extended CAVLC codes) may be used in a transcoder that would be expected to be commercially very viable. Although not absolutely standard compliant, such an implementation would be capable of perfectly transcoding all non-pathological bitstreams (e.g., all bitstream with residuals only 1-bit deeper than the samples of the original video).

Third, for a non-extended H.264, an inexpensive transcoder cannot correctly transcode all possible CABAC bitstreams that could naturally arise from encoding with very small quantization factors (e.g., very small QPs). Such a videostream would typically occur in applications that use nearly lossless encoding (e.g., non-consumer distribution applications).

In such a case, another variation on our inexpensive CABAC-to-CAVLC transcoder would simply clip transform coefficients from the CABAC stream that are too large to represent in the CAVLC bitstream. For consumer distribution types of applications, the frequency of occurrence of any minor mismatch introduced through such an implementation would be negligible. Such a transcoder would typically only exhibit observable mismatch between the original and transcoded video stream for either pathological bitstreams, or very infrequently for bitstreams used in professional applications that are very nearly lossless.

As mentioned above, part of the present invention presents a ECAVLC (e.g., a proposal to extend the CAVLC codes to be able to represent larger coefficients).

One embodiment adds an additional level_prefix code of "16" to the current LEVEL_PREFIX codes in H.264 (e.g., a "0" through "15"). The new LEVEL_PREFIX code would comprise either the bit string "0000 0000 0000 0000" or the bit string "0000 0000 0000 0000 1". Decoding a particular bit string indicates that the size of the level_suffix is some number bits (e.g., B) greater than 12. The number B may be different for each bitdepth of video used in the H.264/PExt standard. For internal use in an encoder for H.264, the number B may be 14-bits (to be able to fully represent all possible coefficient values). For 8 X bit video samples, the number B should typically be 14 X bits.

A second embodiment may be to redefine the existing level_prefix code of "15" (e.g., using bitstream "0000 0000 0000 0001" in the H.264 standard). A level_suffix of size B-bits (as described above) may be implemented rather than the current 12-bits used by the current CAVLC.

A third embodiment may be used to introduce the new level_prefix code of "16" as defined above and to change the encoding of the suffix part of the code to be an exponential-Golomb code. In this case, the extended CAVLC code would be capable of representing coefficients with any number of bits and would be immediately applicable to a future standard defining a particular bitdepth of samples.

Figure 4:
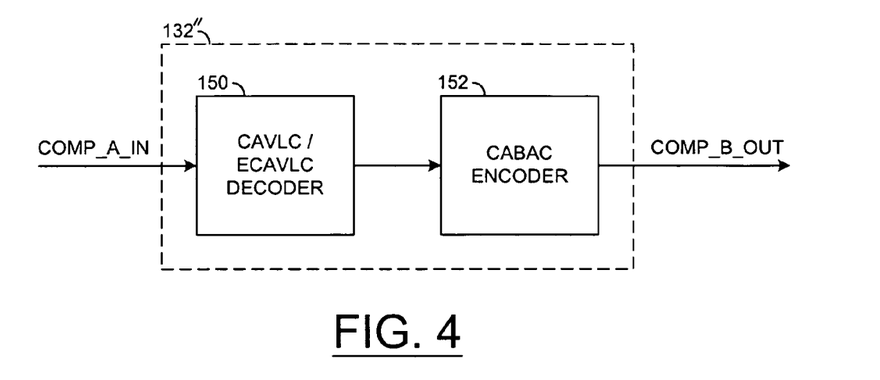
FIG. 4 is a diagram of a transcoder.

Referring to FIG. 4, a diagram of the circuit 132" is shown. The circuit 132" generally comprises a block (or circuit) 150 and a block (or circuit) 152. The block 150 may be implemented as a CAVLC/ECAVLC decoder. A block 152 may be implemented as a CABAC encoder.

Figure 5:
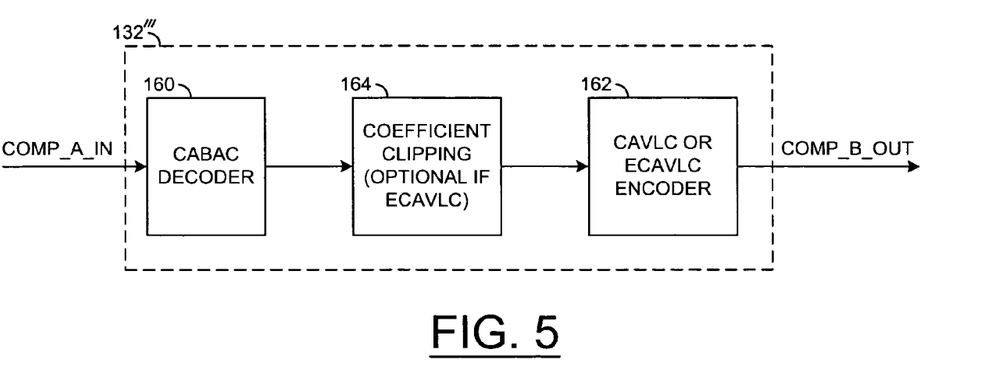
FIG. 5 is a diagram of an alternate implementation of a transcoder.

Referring to FIG. 5, an alternate implementation of the block 132''' is shown. The block 132''' generally comprises a block (or circuit) 160, a block (or circuit) 162, and a block (or circuit) 164. The block 160 may be implemented as a CABAC decoder. The block 162 may be implemented as a CAVLC or ECAVLC encoder. The block 164 may be implemented as a coefficient clipping block.

Figure 6:
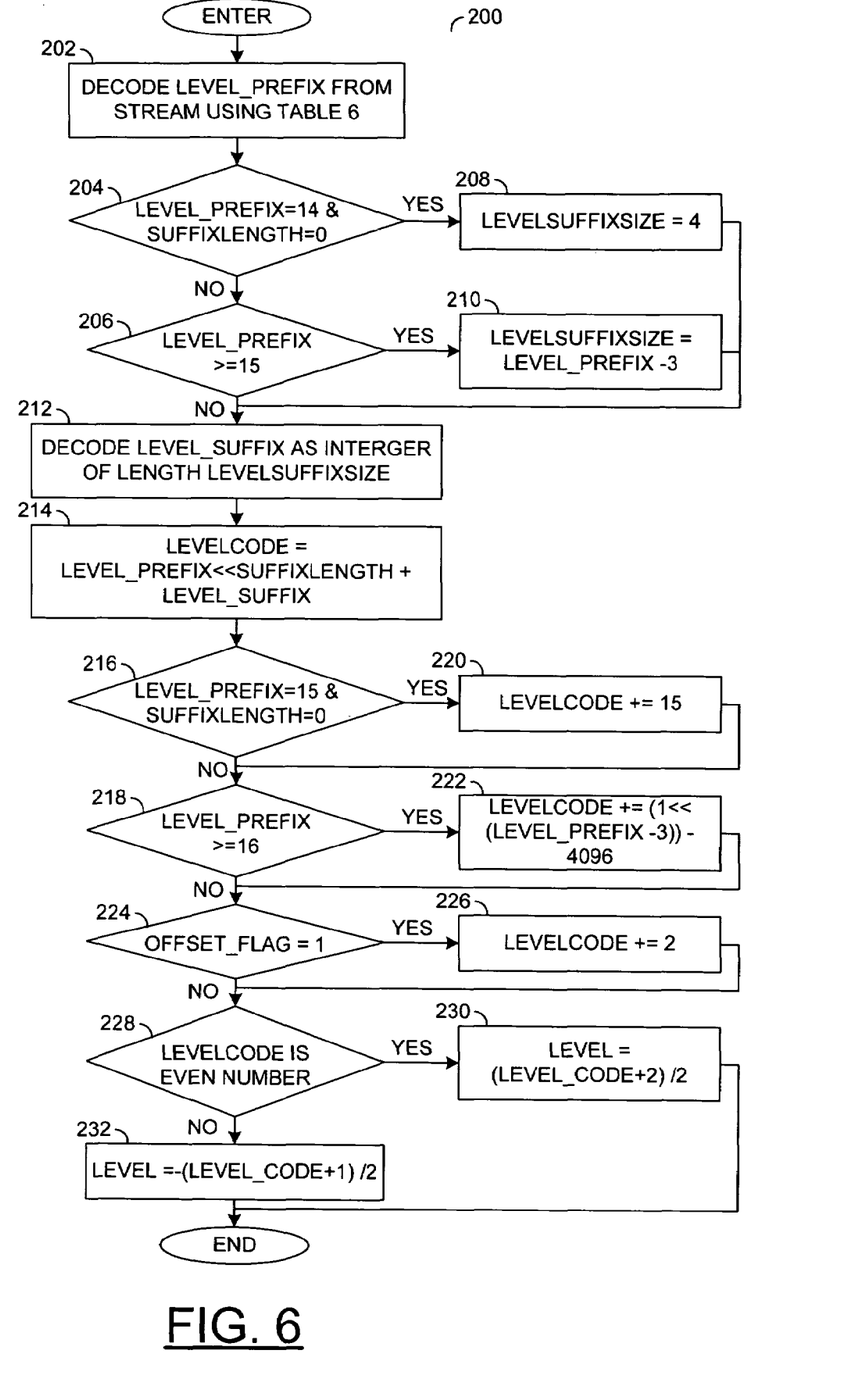
FIG. 6 is a diagram of a process in accordance with the present invention.

Referring to FIG. 6, a method (or process) 200 is shown in accordance with the present invention for parsing on ECAVLC coefficient. A signal OFFSET_FLAG is a signal that is true when it is known that the level is greater than 1. A signal SUFFIXLENGTH is a signal that determines which adaptive code to use. A signal LEVEL is an output that is a signed coefficient level. In general, the method 200 reads the two syntax elements (e.g., element LEVEL_PREFIX and element LEVEL_SUFFIX). The method 200 calculates the level based on the inputs. The LEVEL_PREFIX is read using the TABLE 6. The signal LEVEL_SUFFIX is a variable length integer with a length calculated within the method 200.

The method 200 generally comprises a state 202, a decision state 204, a decision state 206, a state 208, a state 210, a state 212, a state 214, a decision state 216, a decision state 218, a state 220, a state 222, a decision state 224, a state 226, a decision state 228, a state 230, and a state 232. The state 202 may decode a signal LEVEL_PREFIX in accordance with TABLE 6. The decision state 204 determines if the element LEVEL_PREFIX equals 14 and whether the signal SUFFIXLENGTH is equal to 0. If not, the method 200 moves to the decision state 206. If so, the method 200 moves to the state 208 which sets the level suffix size equal to 4. The decision state 206 determines if the signal LEVEL_PREFIX is greater than or equal to 15. If not, the method 200 moves to the state 212. If so, the method 200 moves to the state 210 which sets the level suffix size equal to the LEVEL_PREFIX-3. Next, the state 212 decodes the element LEVEL_SUFFIX as an integer having a length LEVELSUFFIXSIZE. Next, the state 214 sets the signal LEVELCODE equal to the element LEVEL_PREFIX arithmetically left shifted by a number of binary digits determined by the suffix length plus the element LEVEL_SUFFIX.

Next, the decision state 216 determines if the element LEVEL_PREFIX is greater than or equal to 15 and whether the signal SUFFIXLENGTH is equal to 0. If not, the method 200 moves to the state 218. If so, the method moves to the state 220. The state 220 sets the signal LEVELCODE equal to the signal LEVELCODE+15. Next, the decision state 218 determines whether the signal LEVEL_PREFIX is greater or equal to 16. If not, the method 200 moves to the state 224. If so, the method 200 moves to the state 222. The state 222 sets the signal LEVELCODE equal to the signal LEVELCODE+(1 arithmetically left shifted by (LEVEL_PREFIX−3) binary digits) −4096. Next, the state 224 determines if the OFFSET_FLAG is equal to 1. If not, the method 200 moves to the state 228. If so, the method 200 moves to the state 226. The state 226 sets the signal LEVELCODE equal to the signal LEVELCODE+2. Next, the decision state 228 determines if the signal LEVELCODE is an even number. If not, the method 200 moves to the state 232. If so, the method 200 moves to the state 230. The state 230 sets the signal LEVEL equal to (LEVEL_CODE+2)÷2. The state 232 sets the signal LEVEL equal to −(LEVEL_CODE+1)÷2. The signal LEVEL is normally a signed value. The state 230 and the state 232 calculate both the sign and the magnitude of the signal LEVEL.

The following TABLE 1 illustrates the incrementing as described in FIG. 6.

TABLE 1

| level_prefix | bit string |
|---|---|
| 0 | 1 |
| 1 | 01 |
| 2 | 001 |
| 3 | 0001 |
| 4 | 0000 1 |
| 5 | 0000 01 |
| 6 | 0000 001 |
| 7 | 0000 0001 |
| 8 | 0000 0000 1 |
| 9 | 0000 0000 01 |
| 10 | 0000 0000 001 |
| 11 | 0000 0000 0001 |
| 12 | 0000 0000 0000 1 |
| 13 | 0000 0000 0000 01 |
| 14 | 0000 0000 0000 001 |
| 15 | 0000 0000 0000 0001 |
| 16 | 0000 0000 0000 0000 0 |
| 17 | 0000 0000 0000 0000 10 |
| 18 | 0000 0000 0000 0000 110 |
| 19 | 0000 0000 0000 0000 1110 |
| 20 | 0000 0000 0000 0000 1111 0 |
| — | — |

The present invention may be used internally in an encoder chip as a proprietary method for internally transcoding between ECAVLC (or CAVLC) and CABAC for H.264 streams. The present invention may be implemented with far less resources than the alternatives for transcoding both external and chip-internal streams from CAVLC-to-CABAC for H.264 and for H.264/PExt. The present invention may be implemented in an encoder to provide the ability to fully produce all valid coefficient values. The present invention may also be valuable as a CAVLC-to-CABAC transcoder for H.264/PExt (if the PExt adopts extended CAVLC codes). The present invention provides an encoder that has the ability to produce a CABAC bitstream that will be guaranteed to be easily transcodable by all cheap CABAC-to-CAVLC H.264 transcoders.

While the invention has been particularly shown and described with reference to the preferred embodiments thereof, it will be understood by those skilled in the art that various changes in form and details may be made without departing from the spirit and scope of the invention.

The invention claimed is:

1. A method for transcoding between video streams using different entropy coding, comprising the steps of:
    (A) decoding a first video stream received into a first circuit using a first set of entropy codes to generate a first intermediate signal carrying a plurality of transform coefficients;
    (B) parsing said transform coefficients from said first intermediate signal;
    (C) generating a plurality of second transform coefficients by clipping said first transform coefficients parsed from said first intermediate signal;
    (D) generating a second video stream by entropy encoding said second intermediate signal using a second set of entropy codes; and
    (E) generating a second videostream with a third circuit by entropy encoding said second circuit intermediate signal using a second set of entropy codes,
    wherein said generating of said second transform coefficients is applied to each of said first transform coefficients having values greater than a maximum value that can be represented by said second set of entropy codes.

2. The method according to claim 1, wherein said first set of entropy codes comprises context adaptive binary arithmetic coding codes.

3. The method according to claim 1, wherein said second set of entropy codes comprises extended context adaptive variable length coding codes.

4. The method according to claim 1, wherein said second set of entropy codes comprises context adaptive variable length coding codes.

5. An apparatus comprising:
a first circuit configured to decode a first videostream using a first set of entropy codes to generate a first intermediate signal carrying a plurality of first transform coefficients;
a second circuit configured to (i) parse said first transform coefficients from said first intermediate signal, (ii) generate a plurality of second transform coefficients by clipping said first transform coefficients parsed from said first intermediate signal, and (iii) generate a second intermediate signal comprising said second transform coefficients; and
a third circuit configured to generate a second videostream by entropy encoding said second intermediate signal using a second set of entropy codes,
wherein said generating of said second transform coefficients is applied to each of said first transform coefficients having values greater than a maximum value that can be represented by said second set of entropy codes.

6. The apparatus of claim 5, wherein said apparatus is part of a transcoder circuit.

7. The apparatus according to claim 5, wherein said first set of entropy codes comprises context adaptive binary arithmetic coding codes.

8. The apparatus according to claim 5, wherein said second set of entropy codes comprises extended context adaptive variable length coding codes.

9. The apparatus according to claim 5, wherein said second set of entropy codes comprises context adaptive variable length codes.

10. The apparatus according to claim 9, wherein:
said second transform coefficients are clipped within a range that is representable by said context adaptive variable length coding codes; and
said range is determined based on a bit depth of a plurality of pixel samples in said first videostream.

11. An apparatus comprising:
means for configured to decode a first videostream using a first set of entropy codes to generate a first intermediate signal carrying a plurality of first transform coefficients;
means for configured to (i) parsing said first transform coefficients from said first intermediate signal, (ii) generating a plurality of second transform coefficients by clipping said first transform coefficients parsed from said first intermediate signal, and (iii) generating a second intermediate signal comprising said second transform coefficients; and
means for generating a second videostream by entropy encoding said second intermediate signal using a second set of entropy codes,
wherein said generating of said second transform coefficients is applied to each of said first transform coefficients having values greater than a maximum value that can be represented by said second set of entropy codes.

12. The method according to claim 1, further comprising the step of:
encoding an input video signal with said first set of entropy codes to generate said first videostream.

13. The method according to claim 1, further comprising the step of:
decoding said second videostream with said second set of entropy codes to generate an output video signal.

14. The method according to claim 1, wherein said second set of entropy codes comprises a first level prefix bit string of 0000 0000 0000 0000 0 and a second level prefix bit string (a) beginning with 0000 0000 0000 0000, (b) having a 1 and (c) ending with a single 0.

15. The method according to claim 4, further comprising the step of:
determining a range that is representable by said context adaptive variable length coding codes based on a bit depth of a plurality of pixel samples in said first videostream, wherein said clipping of said first transform coefficients is within said range.

16. The apparatus according to claim 5, wherein said generation of said second transform coefficients is applied to each of said first transform coefficients having values too large to be represent by said second set of entropy codes.

17. The apparatus according to claim 5, further comprising a fourth circuit configured to encode an input video signal with said first set of entropy codes to generate said first videostream.

18. The apparatus according to claim 5, further comprising a fourth circuit configured to decode said second videostream with said second set of entropy codes to generate an output video signal.

19. The apparatus according to claim 5, wherein said second set of entropy codes comprises a first level prefix bit string of 0000 0000 0000 0000 0 and a second level prefix bit string (a) beginning with 0000 0000 0000 0000, (b) having a 1 and (C) ending with a single 0.

* * * * *